United States Patent
Inui et al.

(10) Patent No.: US 8,242,595 B2
(45) Date of Patent: Aug. 14, 2012

(54) HEATSINK AND SEMICONDUCTOR DEVICE WITH HEATSINK

(75) Inventors: Tsuyoshi Inui, Hirakata (JP); Hideo Kado, Hirakata (JP); Yoshinobu Kawamoto, Uda (JP)

(73) Assignee: Panasonic Electric Works Sunx Co., Ltd., Aichi (JP)

( * ) Notice: Subject to any disclaimer, the term of this patent is extended or adjusted under 35 U.S.C. 154(b) by 1034 days.

(21) Appl. No.: 12/187,715

(22) Filed: Aug. 7, 2008

(65) Prior Publication Data

US 2009/0039502 A1    Feb. 12, 2009

(30) Foreign Application Priority Data

Aug. 10, 2007  (JP) .................................. 2007-210065
Jul. 16, 2008  (JP) .................................. 2008-185350

(51) Int. Cl.
  *H01L 23/473*    (2006.01)
(52) U.S. Cl. ......... 257/714; 257/E23.083; 257/E23.098; 257/E33.075; 165/80.4; 361/699; 362/294
(58) Field of Classification Search .................. 257/714, 257/E23.083, E23.098, E33.075; 156/80.4; 361/699; 362/294
  See application file for complete search history.

(56) References Cited

U.S. PATENT DOCUMENTS

| | | | | |
|---|---|---|---|---|
| 1,895,887 A | * | 1/1933 | Lorenz | 362/294 |
| 2,943,534 A | * | 7/1960 | Pierschel | 352/146 |
| 4,138,692 A | * | 2/1979 | Meeker et al. | 257/697 |
| 4,494,171 A | * | 1/1985 | Bland et al. | 361/704 |
| 4,561,040 A | * | 12/1985 | Eastman et al. | 361/699 |
| 4,644,385 A | * | 2/1987 | Nakanishi et al. | 257/713 |
| 4,759,403 A | * | 7/1988 | Flint et al. | 165/80.4 |
| 5,166,863 A | * | 11/1992 | Shmunis | 361/699 |
| 6,876,548 B2 | * | 4/2005 | Yatougo et al. | 361/690 |
| 7,108,400 B2 | * | 9/2006 | Yamada et al. | 362/294 |
| 7,235,878 B2 | * | 6/2007 | Owen et al. | 257/714 |
| 7,304,418 B2 | * | 12/2007 | Nagata et al. | 313/32 |
| 7,482,636 B2 | * | 1/2009 | Murayama et al. | 257/98 |
| 7,490,949 B2 | * | 2/2009 | Medinis | 362/105 |
| 7,812,365 B2 | * | 10/2010 | Murayama | 257/99 |

(Continued)

FOREIGN PATENT DOCUMENTS

CN    201298538    8/2009

(Continued)

*Primary Examiner* — David Vu
*Assistant Examiner* — Earl Taylor
(74) *Attorney, Agent, or Firm* — Drinker Biddle & Reath LLP (57) ABSTRACT

A heatsink carries a UV-ray light emitting diode. Flow passages for causing circulation of a fluid that cools the UV-ray light emitting diode are opened in the heatsink. Supply ports and discharge ports are opened in a mount surface of a header where supply and discharge of the fluid for cooling purpose to and from the heatsink are performed. A pair of circulation orifices corresponding to the supply port and the discharge port are opened in the contact surface that contacts the mount surface in the heatsink. Recesses are formed around the respective circulation orifices, and an annular sealing member that exhibits rubber elasticity and that is compressed between the heatsink and the header is disposed in each of the recesses.

15 Claims, 5 Drawing Sheets

U.S. PATENT DOCUMENTS

| | | |
|---|---|---|
| 2004/0150951 A1* | 8/2004 | Yatougo et al. ............... 361/690 |
| 2007/0090737 A1 | 4/2007 | Hu et al. |
| 2007/0131954 A1* | 6/2007 | Murayama et al. ............. 257/98 |
| 2008/0180015 A1* | 7/2008 | Wu et al. .......................... 313/46 |
| 2008/0212332 A1* | 9/2008 | Medinis ........................ 362/373 |
| 2009/0039380 A1* | 2/2009 | Inui et al. ........................ 257/99 |
| 2009/0039502 A1* | 2/2009 | Inui et al. ..................... 257/714 |
| 2009/0097265 A1* | 4/2009 | Sun et al. ...................... 362/373 |
| 2009/0213583 A1* | 8/2009 | Chang et al. ................. 362/218 |
| 2010/0046231 A1* | 2/2010 | Medinis ........................ 362/294 |
| 2010/0096967 A1* | 4/2010 | Marinus et al. ................. 313/46 |
| 2010/0187560 A1* | 7/2010 | Traupe et al. .................... 257/99 |

FOREIGN PATENT DOCUMENTS

| | | |
|---|---|---|
| DE | 20 2007 007 003 U1 | 7/2007 |
| EP | 1 681 728 A1 | 7/2006 |
| JP | 2005-268650 | 9/2005 |
| JP | 2006-019676 | 1/2006 |
| SG | 148111 | 12/2008 |
| TW | 200634398 | 10/2006 |
| WO | WO 2006/101526 A2 | 9/2006 |
| WO | WO 2007/086353 A1 | 8/2007 |

* cited by examiner

HEATSINK AND SEMICONDUCTOR DEVICE WITH HEATSINK

BACKGROUND OF THE INVENTION

1. Field of the Invention

The present invention relates to a heatsink that cools a heating element by use of a fluid for cooling purpose as well as to a semiconductor device having a heatsink for which a heating element is a semiconductor element.

2. Related Art

A radiator and a heatsink have hitherto been used for cooling a heating element, such as a semiconductor element. In particular, since calorific power of a power semiconductor is large, a configuration for circulating a fluid for cooling purpose within a heat sink has been put forward (see, for instance, JP-A-2006-19676).

JP-A-2006-19676 describes a unit module light source in which a heatsink provided with a light emitting diode serving as a heating element is fastened to a fixing jig by screws. There is also a description about use of, between the heatsink and the fixing jig, a resin or metal member for coupling a supply port for introducing a fluid for cooling purpose into a heatsink and a discharge port for discharging the fluid from the heatsink to a supply port and a discharge port of the fixing jig without involvement of water leaks.

Further, in order to arrange a plurality of unit module light sources, JP-A-2006-19676 describes use of a member for coupling the supply ports and the discharge ports of the unit module light sources together without involvement of water leaks. In short, watertight coupling of the fixing jigs is described.

The technique described in JP-A-2006-19676 states use of the resin or metal member at the time of coupling of the heatsink to the fixing jig as one-on-one relationship. In such a structure, it is possible to integrate plural heatsinks by coupling plural fixing jigs. However, there has been a problem that possibility of occurrence of leakage of water becomes relatively high because plural locations have to be coupled in a watertight manner. Further, a specific structure to prevent occurrence of leakage of water from the supply ports or the discharge ports is not described, and prevention of leakage of water is considered to be attained by sandwiching the resin or metal member between planes.

SUMMARY OF THE INVENTION

The present invention has been conceived in light of the circumstance and aims at providing a heatsink which suppresses occurrence of leakage of a fluid by reducing the number of locations that have to be coupled in a watertight manner by integrating plural heatsink into one header, as well as providing a semiconductor device with such heatsinks.

A first aspect of the invention is directed toward a heatsink adapted to be coupled to a mount surface of a header in which a supply path and a discharge path for passing a cooling fluid are formed, the heatsink comprising:

a heatsink body which supports a heating element and in which a flow passage for the cooling fluid is formed therein, the heatsink body being coupled to the header so that a contact surface of the heatsink body is brought into contact with the mount surface of the header, wherein a first circulation orifice through which the cooling fluid is introduced from the supply path and a second circulation orifice through which the cooling fluid is discharged to the discharge path are formed on the contact surface of the heatsink body, a plurality of supply ports through which the cooling fluid is supplied to the first orifice by communicating with the supply path and a plurality of discharge ports through which the cooling fluid is discharged by communicating with the discharge path are formed on the mount surface of the header;

a plurality of the heatsink bodies are coupled to the header; and the first circulation orifice is coupled to one of the supply ports in a watertight manner and the second circulation orifice is coupled to one of the discharge ports in a watertight manner.

A second aspect of the invention is characterized in that a sheet-shape sealing member is interposed between the heatsink body and the header so as to couple between the heatsink body and the header in a watertight manner, and a supply hole which communicates the first circulation orifice and the supply port with each other and a discharge hole which communicates the second circulation orifice and the discharge port with each other are formed in the sealing member so as penetrate in a thickness direction of the sealing member.

A third aspect of the invention is characterized in that a first receiving tube which communicates with the supply path at one end thereof and is opened to the supply port at another end thereof and a second receiving tube which communicates with the discharge path at one end thereof and is opened to the discharge port at another end thereof are formed in the header, the heat sink body includes a pair of insertion tubes provided on the contact surface so as to project therefrom and so as to be inserted into the first and second receiving tubes in the header, a first circulation orifice is penetrated in one of the insertion tubes, and a second circulation orifice is penetrated in another of the insertion tubes, sealing members are provided inside of the first and second receiving tubes and are brought into contact with outer peripheral surfaces of the insertion tubes, so that inner peripheral surfaces of the first and second receiving tubes and the outer peripheral surfaces of the insertion tubes are sealed in a watertight manner.

A fourth aspect of the invention is characterized in that recesses are formed at least either around the circulation orifices in the contact surface of the heatsink body or around the supply port and the discharge port in the mount surface of the header, annular sealing members that exhibit rubber elasticity are disposed in the recesses, and the heatsink body is joined to the header such that the sealing members are compressed between the heatsink body and the header.

A fifth aspect of the invention is characterized in that the heating element is a light emitting diode.

A sixth aspect of the invention is characterized in that the header is formed with an insulating synthetic resin material.

A seventh aspect of the invention is directed to a semiconductor device comprising: a heat sink as described above, wherein the heating element is a semiconductor element, the heatsink body is provided with a stacked body including a base substrate provided with a metal plate and thermally coupled to the semiconductor element as well as electrically connected with one electrode of the semiconductor element, and a cover substrate provided with a metal plate and electrically connected with another electrode of the semiconductor element and an insulating material layer insulating between the base substrate and the cover substrate.

In the first aspect of the invention, the plural supply ports through which the cooling fluid is supplied to the first orifice by communicating with the supply path and the plural discharge ports through which the cooling fluid is discharged by communicating with the discharge path are formed on the mount surface of the header, and a plurality of the heatsink bodies are coupled to the header. Accordingly, by coupling the first circulation orifices formed in the heatsink bodies to the supply ports on the header in a watertight manner and coupling the second circulation orifices formed in the heatsink bodies to the discharge ports on the header in a water tight manner, the plural heatsink bodies can be integrated so that the leakage of the fluid is not occurred. Further, when a device integrating the heatsink bodies is constructed, watertight couplings are provided only at locations that are twice as much as the number of heatsink bodies. The number of the locations that have to be coupled in the watertight manner can be made almost haft of the number of locations in the conventional structure in which the fixture jigs are also coupled in the watertight manner. Therefore, the possibility of occurrence of the leakage of fluid can be reduced based on the reduction in the locations.

Further, since the plural heatsink bodies are coupled to one header, the supply and discharge of the cooling fluid to the plurality of heatsink main bodies can be collectively managed by grouping flow paths for the cooling fluid to the plurality of heatsink main bodies by the header. Further, since one header is available for the plurality of heatsink main bodies, the essential requirement is to manage the leakage of the cooling fluid at locations where the heatsink main bodies are joined to the header, and the number of items to be managed can be reduced. This contributes to operability achieved during maintenance and inspection.

In addition, when the first and second circulation orifices formed in the heatsink body and the supply port and the discharge port on the header are coupled in the watertight manner, it is possible to couple these members each other easily after positioning. Therefore, work for joining the heat sink main bodies to the header becomes easy, and work for replacing the heat sink main bodies is facilitated.

In the second aspect of the invention, since the sheet-shape sealing member is interposed between the heatsink body and the header, only one sheet of the sealing member is used for the first and second orifices even in a case that the sealing member is provided individually for each heatsink body. It is possible to maintain the watertight couplings with a relatively small number of the seaming member, that is, only the sealing members of the same number as the heatsink bodies. Further, it is also possible to provide one sheet of the sealing member for plural heatsink bodies. Accordingly, it is possible to provide with a smaller number of the parts. In addition, in a case that the sealing member is formed with an insulating material, the heatsink body can double as the electrode, and even in a case that the header is made of a metal, the sealing member can double as the insulating material that is disposed between the heatsink body and the header. As a result, the number of the parts can be reduced.

In the third aspect of the invention, the insertion tubes projecting on the heatsink body are inserted in the receiving tubes provided in the header, and a watertight sealing is performed between the insertion tubes and the receiving tubes by the sealing members provided inside the receiving tubes. Accordingly, watertight performance can be enhanced by making a sealing distance long at the sealing locations. Further, by inserting the insertion tubes in the receiving tubes in the header, the heatsink body can be positioned and tentatively fixed on the header. Therefore, the mounting process of the heatsink body to the header can be performed easily.

In the fourth aspect of the invention, recesses are formed at least either around the circulation orifices in the contact surface of the heatsink body or around the supply port and the discharge port in the mount surface of the header, annular sealing members that exhibit rubber elasticity are disposed in the recesses, and the heatsink body is joined to the header such that the sealing members are compressed between the heatsink body and the header. Therefore, the sealing members are brought into almost linear contacts with the heatsink body and the header. It is possible to closely contact the sealing members with the heatsink body and the header regardless of flatness of the heatsink body and the header. As a result, no gap is formed between the heatsink body and the sealing members as well as between the header and the sealing members, and the leakage of the cooling fluid is hardly occurred even if high pressured is exerted.

In the fifth aspect of the invention, by cooling the light emitting diode, it is possible to obtain a high output light source using a light emitting diode. In general, the light emission efficiency is deteriorated when the temperature of the light emitting diode is elevated. In the invention, by forcibly cooling the light emitting diode by circulating the cooling fluid, it is possible to suppress the temperature rise even when large current is input, and it is possible to illuminate the light source with high output maintaining the light emission efficiency.

In the sixth aspect of the invention, since the header is formed with the insulating synthetic resin material, it is possible to mount the heatsink body on the header so as to directly contact with each other even in a case that the heatsink body doubles as an electrode. Therefore, it is not necessary to interpose an insulating material between the heatsink body and the header as it is in a case that the header is made of a metal. Thus, the number of parts can be reduced.

In the seventh aspect of the invention, the heatsink body is provided by interposing the insulating material layer between two metal plates of the base substrate and the cover substrate. Two electrodes of the semiconductor device mounted on the cover substrate are connected with the base substrate and the cover substrate, respectively. Therefore, it is possible to increase electrode areas to increase large current capacity as compared with a case in which terminal pins and lead wires are used for electric connections. In addition, since the heatsink body doubles as electric connection sections, it is possible to reduce projecting parts from the heatsink body as compared with a case in which electric connection sections such as terminal pins and lead wires are separately provided. Therefore, the heatsink body can be easily attached to the header or other members and can be housed compactly.

DETAILED DESCRIPTION OF THE PREFERRED EMBODIMENT

First Embodiment

A heatsink to be described below is explained by taking, as an example, a case where the heatsink includes a UV-ray light emitting diode as a heating element. Incidentally, in the invention, not only the UV-ray light emitting diode emitting light of ultra-violet ray wavelength range, but also a light emitting diode other than the UV-ray light emitting diode, such as one emitting light of visible wavelength range, can be adapted as the heating element. Further, other power semiconductor elements can be also adapted as the heating element.

Figure 1:
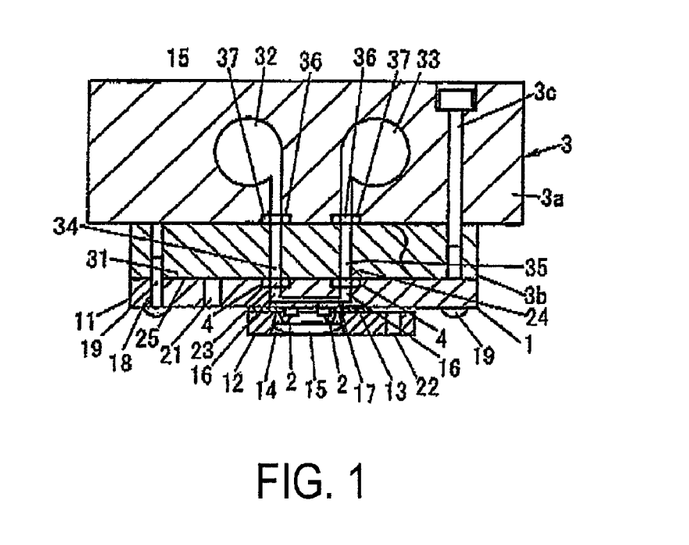
FIG. 1 is a cross-sectional view showing an example use of a heatsink body of a first embodiment.
Figure 2A:
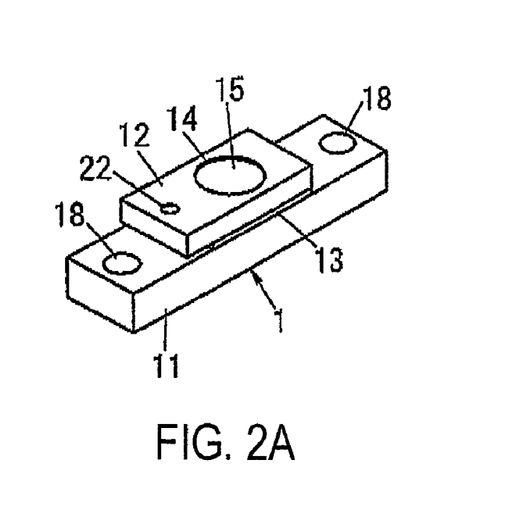
FIG. 2A is a perspective view of a front side of the heatsink body.
Figure 2B:
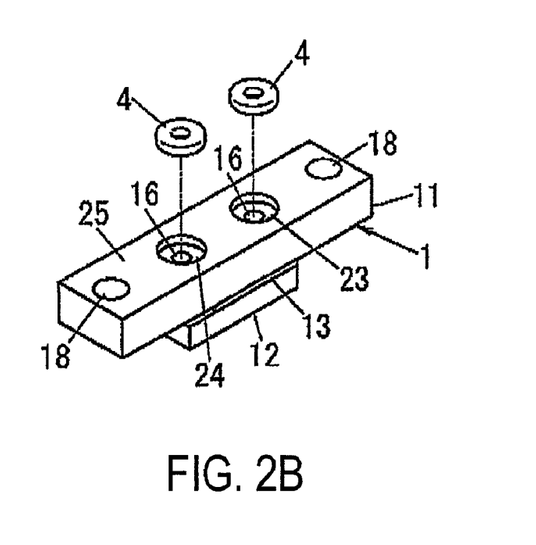
FIG. 2B is a perspective view of a rear side of the heatsink body.
Figure 3A:
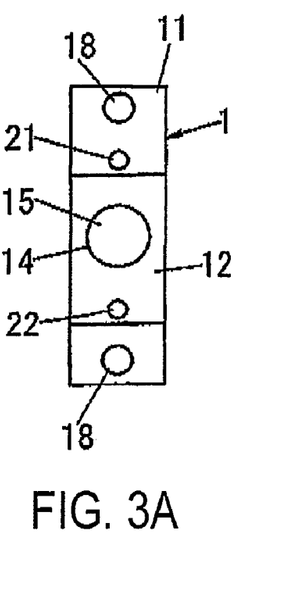
FIG. 3A is a front view of the heatsink body.
Figure 3B:
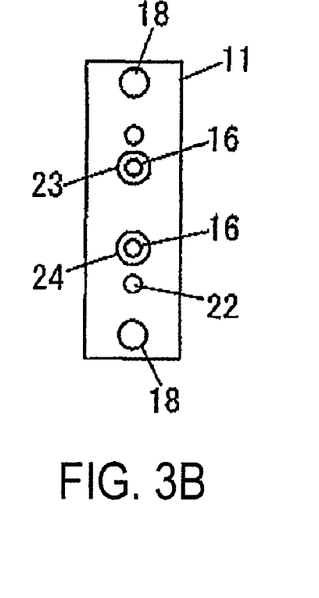
FIG. 3B is a rear view of the heatsink body.
Figure 3C:
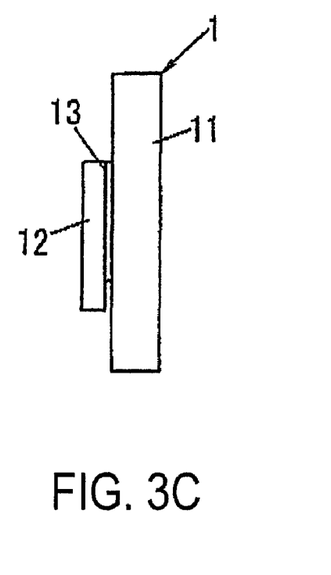
FIG. 3C is a side view of the heatsink body.

As shown in FIGS. 1 through 3, a heatsink body 1 is constructed as a layered product generated by stacking a base substrate 11 made of a metal plate on which a UV-ray light emitting diode 2 corresponding to a bear chip is mounted, a cover substrate 12 made of a metal plate surrounding an area of the base substrate 11 where the UV-ray light emitting diode 2 is mounted, and an insulating material layer 13 that is interposed between the base substrate 11 and the cover substrate 12 and that insulates the base substrate 11 from the cover substrate 12. A copper element or a copper-based alloy is used for the base substrate 11 and the cover substrate 12.

As shown in FIG. 1, one electrode (the anode) of the UV-ray light emitting diode 2 is connected directly to the base substrate 11 by die bonding. The other electrode (the cathode) of the UV-ray light emitting diode 2 is connected to the cover substrate 12 by wire bonding. In a word, one electrode of the UV-ray light emitting diode 2 is electrically connected to the base substrate 11, and the other electrode of the same is electrically connected to the cover substrate 12.

An exposure hole 14 is opened in the cover substrate 12 so as to uncover the UV-ray light emitting diode 2 mounted on the base substrate 11. An inner circumferential surface of the exposure hole 14 is tapered such that the inner diameter of the exposure hole 14 becomes greater with an increasing distance from the base substrate 11. A floodlight lens 15 having a convexly-curved (e.g., spherical) exterior surface is fitted in the exposure hole 14. Consequently, the UV-ray light emitting diode 2 is housed in an enclosed space surrounded by the base substrate 11, the cover substrate 12, and the floodlight lens 15 and shielded from the influence of the environment, such as a humidity. Luminous intensity distribution of light radiating from the UV-ray light emitting diode 2 can be controlled by adjusting the position and characteristic of the floodlight lens 15 or the angle of inclination or reflectance of the inner circumferential surface of the exposure hole 14.

A pair of circulation orifices 16, each of which is circularly opened, are formed in the back of the base substrate 11 (a surface opposite to the surface of the base substrate 11 where the cover substrate 12 is mounted). Flow passages 17 for establishing mutual communication between the circulation orifices 16 are formed in the base substrate 11. Each of the flow passages 17 is formed so as to pass a neighborhood of the base substrate 11 where the UV-ray light emitting diode 2 is mounted, whereby the degree of thermal coupling between a fluid for cooling purpose flowing through the flow passage 17 and the UV-ray light emitting diode 2 is enhanced. Water can be used for the fluid for cooling purpose, but a material other than water can also be used, so long as the material is in a liquid state at room temperatures and exhibits specific heat capacity close to one.

As shown in FIG. 3, in the present embodiment, both the base substrate 11 and the cover substrate 12 are formed into the shape of a rectangle and to the essentially-same width when viewed from the front of the floodlight lens 15. However, the base substrate 11 and the cover substrate 12 differ from each other in terms of a length, and the base substrate 11 is formed so as to become longer than the cover substrate 12. Moreover, the longitudinal center of the base substrate 11 is positionally different from the longitudinal center of the cover substrate 12; or to put it another way, one end of the cover substrate 12 in its longitudinal direction is extended to one side of the base substrate 11 along its longitudinal direction. The center of the floodlight lens 15 is aligned to the longitudinal center of the base substrate 11. Both of the circulation orifices 11 are formed while spaced apart from each other along the longitudinal direction of the base substrate 11.

A mount hole 13 is formed at each longitudinal end of the base substrate 11. Further, a connection hole 21 and a connection hole 22, each of which is a screw hole, are opened in the base substrate 11 and the cover substrate 12, respectively. The respective connection holes 21 and 22 are positioned between the longitudinal center of the base substrate 11 and the respective mount holes 18. An equidistance exists between the longitudinal center of the base substrate 11 and the respective connection holes 21 and 22. The connection holes 21 and 22 are provided for electrical connection of the UV-ray light emitting diode 2.

Incidentally, circularly-opened recesses 23 and 24 are formed around the respective circulation orifices 16. Put another way, the respective circulation orifices 16 are opened in inner bottom surfaces of the recesses 23 and 24, and the respective circulation orifices 16 are formed concentrically on the respective recesses 23 and 24.

Figure 4:
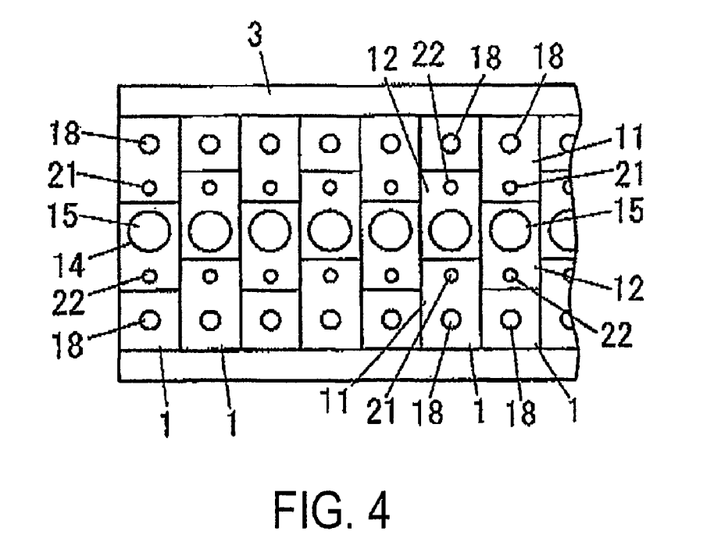
FIG. 4 is a front view showing the example use of the heatsink body.
Figure 5:
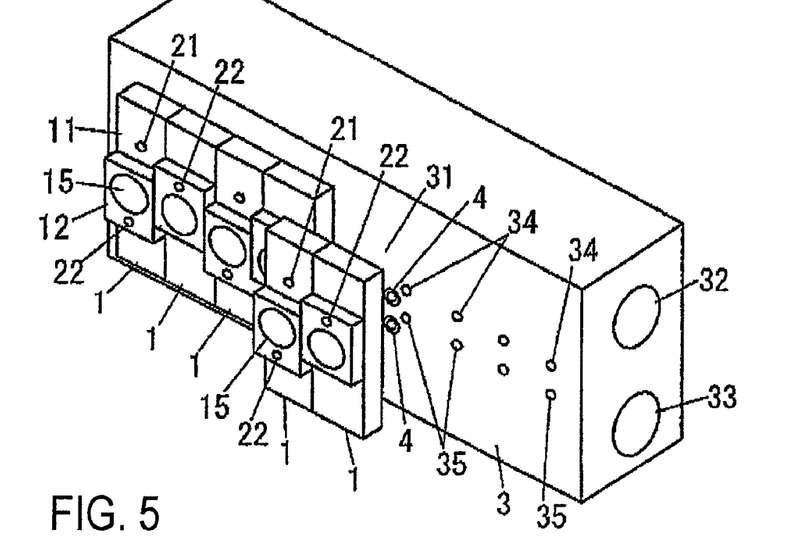
FIG. 5 is an exploded perspective view showing the example use of the heatsink body.

On the occasion of use of the heatsink main bodies 1, the heatsink main bodies are coupled to the header 3 which allows circulation of the fluid for cooling purpose, as shown in FIGS. 1, 4, and 5. The header 3 is constructed by fixedly fastening a support table 3a made of a metal material and a spacer 3b made of an insulating material by a coupling screw 3c. The coupling screw 3c is screwed into the spacer 3b by penetrating through the support table 3a. The header 3 is not limited to the shape mentioned above. No specific limitations are imposed on the cross-sectional profile of the header 3, so long as a mount surface 31 where the heatsink main bodies 1 are connected becomes a flat plane. A supply path 32 and a discharge path 33 through which the fluid for cooling purpose is circulated are formed in the header 3. Supply ports 34 remaining in mutual communication with the supply path 32 and discharge ports 35 remaining in mutual communication with the discharge path 33 are opened at appropriate locations of the mount surface 31 of the header 3. The spacer 3b is omitted from FIG. 5 for the sake of simplification of indication.

The supply ports 34 and the discharge ports 35 are circularly opened, respectively. Open diameters of the ports are essentially equal to an open diameter of the circulation orifices 16. A distance between the supply port 34 and the discharge port 35 is made equal to the distance between the circulation orifices 16 formed in the heatsink body 1. A set consisting of the supply port 34 and the discharge port 35 is formed in numbers (e.g., in a number of ten) in the header 3.

In order to join the heatsink body 1 to the header 3, the contact surface 25 of the base substrate 11 where the pair of circulation orifices 16 are opened is brought into contact with the mount surface 31 of the header 3, and mount screws 19 are screwed into the header 3 through the mount holes 18. At this time, an axis of the supply port 34 and an axis of the discharge port 35, which are opened in the mount surface 31 of the header 3 and belong to one set, are aligned to respective axes of the circulation orifices 16 of one heatsink body 1. Annular sealing members 4 exhibiting rubber elasticity are fitted into the respective recesses 23 and 24, and the heatsink body 1 is joined to the header 3 such that the sealing members 4 are compressed between the inner bottom surfaces of the recesses 23 and 24 and the mount surface 31 of the header 3, whereupon the supply port 34 and the discharge port 35 are joined to the respective circulation orifices 16 without involvement of a clearance gap. O-rings can be used for the sealing members 4.

The sealing member 4 assumes a circular cross-sectional profile, as well as having an annular shape. When compressed between the heatsink body 1 and the header 3, the sealing member 4 respectively contacts the heatsink body 1 and the header 3 in a state analogous to a line contact, thereby preventing formation of clearance gap. However, since the line contact does not depend on the degree of flatness of the contact surface 25 of the heatsink body 1 and the mount surface 31 of the header 3. The supply port 34 and the discharge port 35 are in mutual communication with the corresponding circulation orifices 16 so as not to cause leakage of the fluid for cooling purpose within a range where the rubber elasticity of the sealing member 4 effectively functions.

The foregoing configuration does not use a pipe or a tube. Hence, it is easy to attach the heatsink main bodies 1 to the header 3. Consequently, operation for joining the heatsink main bodies 1 to the header 3 is facilitated, and operation for replacement of the heatsink main bodies 1 is also facilitated. Put another way, maintenance operation, such as a failure of the heatsink main bodies 1, and the like, becomes easy.

Moreover, a plurality of heatsink main bodies 1 are joined to the header 3, and hence the essential requirement is to manage so as not to cause leakage of the fluid for cooling purpose from the locations where the heatsink main bodies 1 and the header 3 are joined together. When compared with the case where the header 3 is provided for each heatsink body 1, a necessity for connecting the headers 3 to each other is obviated, and the number of locations where leakage of the fluid for cooling purpose is to be managed can be reduced.

The structure for joining the circulation orifices 16 of the heatsink main bodies 1 to the supply ports 34 and the discharge ports 35 of the header 3 is also used between the support table 3a and the spacer 3b of the header 3. Specifically, the supply path 32 and the discharge path 33 must establish mutual communication between the support table 3a and the spacer 3b. Hence, recesses 36 are formed in the support table 3a at the locations on the support table 3a and the spacer 3b where the supply path 32 and the discharge path 33 are to be joined as shown in FIG. 1, and annular sealing members 37 (O-rings) located within the respective recesses 36 are sandwiched between the support table 3a and the spacer 3b, to thus be compressed.

In the above embodiment, the surface of the base substrate 11 opposite the cover substrate 12 in the heatsink body 1 is taken as a contact surface 25. However, a surface of the base substrate 11 adjoining to the surface where the cover substrate 12 is provided can also be taken as the contact surface 25. For instance, one longitudinal end face of the base substrate 11 may also be taken as the contact surface 25, and the circulation orifices 16 may also be provided in the contact surface. Moreover, the circulation orifices 16 may also be provided at respective longitudinal end faces of the base substrate 11 instead of the two circulation orifices 16 being provided in one surface side by side, and the header 3 may also be provided in number of two so as to correspond to the respective circulation orifices 16. Moreover, in the foregoing embodiment, the recesses 23 and 24 are provided in the heat sink body 1. However, the recesses 23 and 24 may also be provided in the header 3, or the recess 23 and 24 may also be provided in both the heatsink body 1 and the header 3.

Second Embodiment

Figure 6:
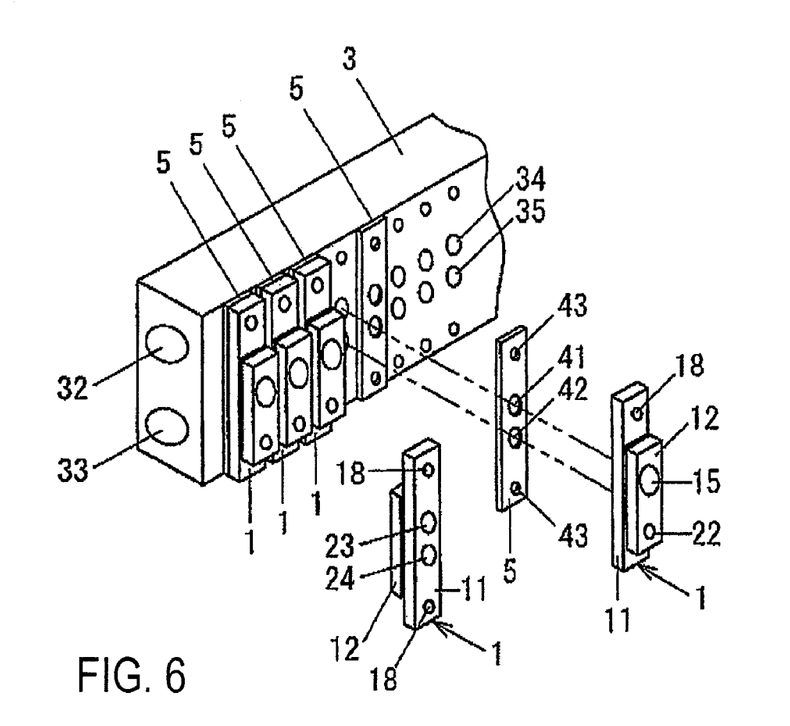
FIG. 6 is an exploded perspective view showing the example use of a heatsink body of a second embodiment.

In the first embodiment, the structure is provided such that the heatsink body 1 and the header 3 are coupled in the watertight manner by use of the annular sealing member 4. On the other hand, in the present embodiment, the structure is provided such that a sheet-shape sealing member 5 is employed instead of the annular sealing member 4. Further, in the first embodiment, the recesses 23 and 24 are provided for housing the sealing members 4 in the heatsink body 1. On the other hand, in the present embodiment, the recesses 23 and 24 are unnecessary.

The sealing member 5 has such dimensions as to be the same as the entire area of the surface of the base substrate 11 constituting the heatsink body 1 that opposes to the header 3. The sealing member 5 is made of a material that exhibits a rubber elasticity similarly to the sealing member 4. In the sealing member 5, a supply hole 41 and a discharge hole 42 for communicating the supply port 34 and the discharge port 35 to the respective circulation orifices 16 are provided so as to penetrate the sealing member 5 at positions corresponding to the circulation orifices 16 in the heatsink body 1. Through holes 43 are also provided in the sealing member 5 at positions corresponding to the mount holes 18 in the heatsink body 1.

Figure 7:
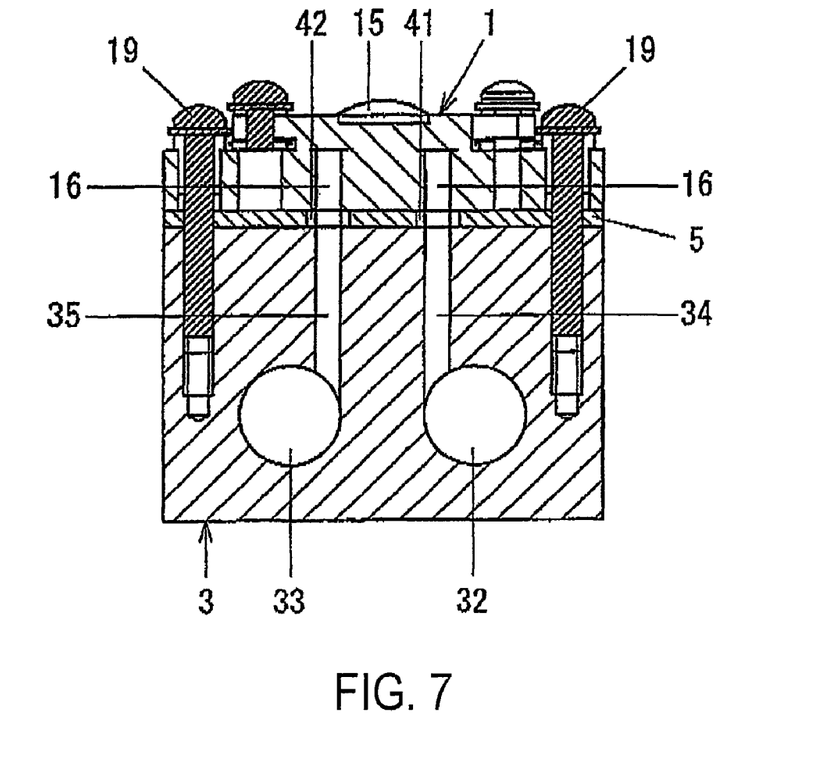
FIG. 7 is a sectional view showing the example use of the heatsink body of the second embodiment.

Consequently, the heatsink body 1 is fixed to the header 3 such that the sealing member 5 is interposed between the heatsink body 1 and the header 1. Therefore, the sealing member 5 is compressed so that the supply port 34 and the discharge port 35 are coupled to the circulation holes 16 in a watertight manner.

In the present embodiment, it is not necessary to provide the recesses 23 and 24 in the heatsink body 1 and only one seat of the sealing member 5 is provided for one heatsink body 1. Therefore, the mounting process of the heatsink body 1 to the header 3 can be easily performed. Further, since the size of the sealing member 5 is made larger than that of the sealing member 4 used in the first embodiment, the sealing member 5 can be handled more easily. Accordingly, the workability of the mounting process of the heatsink body 1 to the header 3 is improved. Furthermore, by providing the sealing member 5 with an insulating material, it is possible to insulate between the heatsink body 1 and the header 3, even when the header 3 is made of a metal. Therefore, if the mount screws 19 formed with an insulating material are used, the spacer 3b can be unnecessary. (FIG. 7 shows a structure in which the spacer 3b is omitted.)

Figure 8:
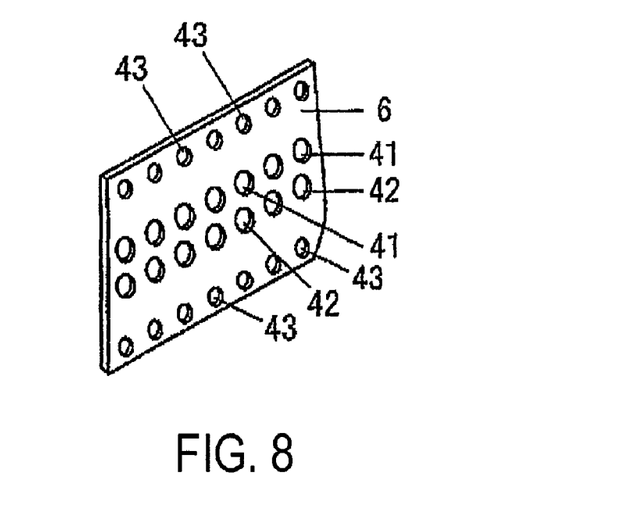
FIG. 8 is a perspective view showing a sealing member used in another example use of the second embodiment.

While the sealing member 5 as described above is provided one sheet for each of the heatsink bodies 1 in the present embodiment, one sheet of the sealing member 6 may be provided for plural heatsinks 1 as shown in FIG. 8. In this structure, the number of the sealing member 6 can be reduced as compared with a case in which the sealing members 5 are provided individually for each of the heatsink bodies 1. Therefore, it is possible to further reduce the number of the parts. In other respects, the second embodiment is identical in structure and operation with the first embodiment.

Third Embodiment

Figure 9:
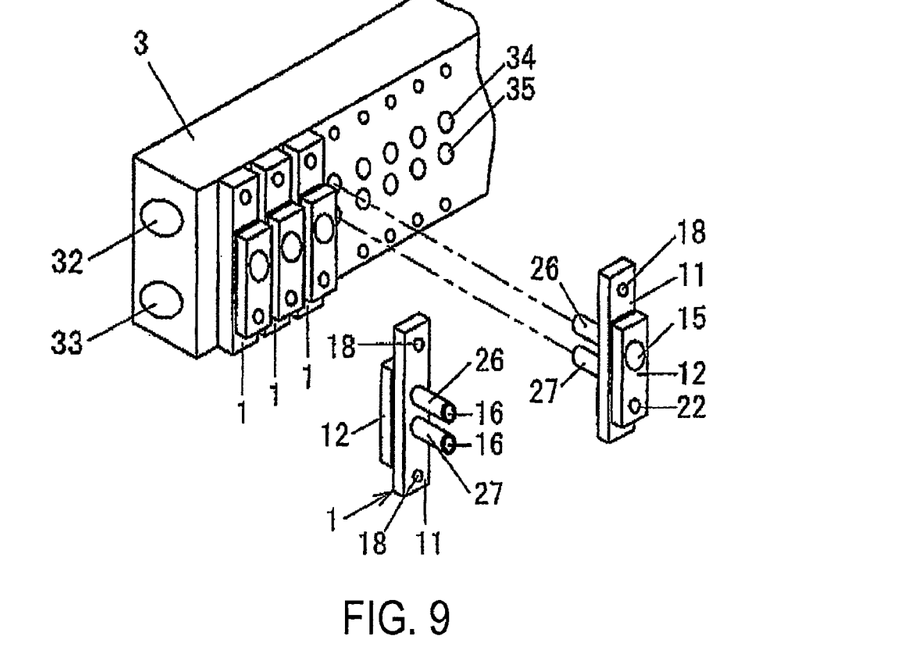
FIG. 9 is an exploded perspective view showing the example use of a heatsink body of a third embodiment.
Figure 10:
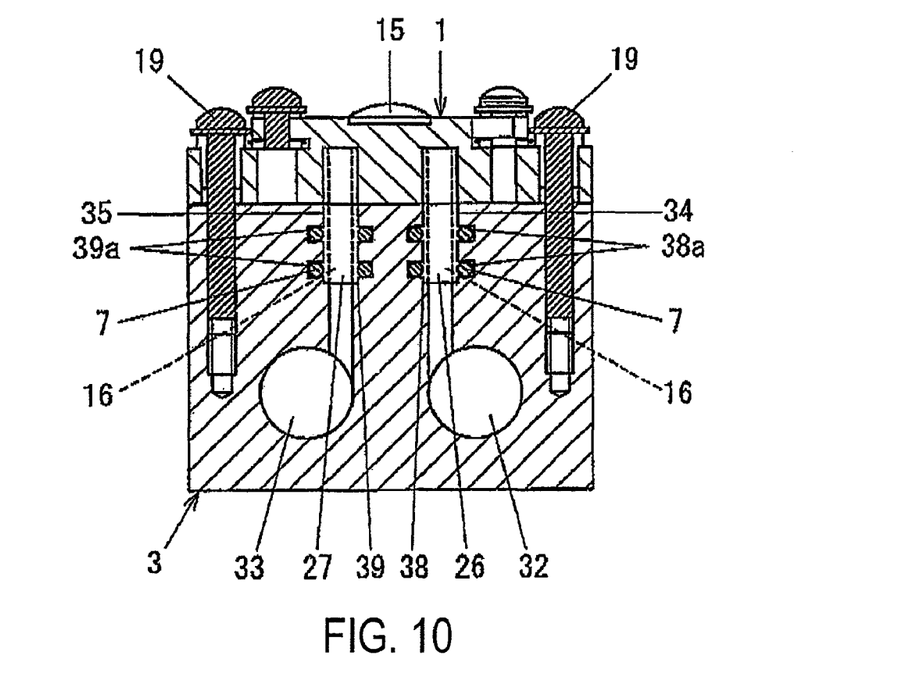
FIG. 10 is a sectional view showing the example use of the heatsink body of the third embodiment.

In the present embodiment, as shown in FIGS. 9 and 10, a pair of insertion tubes 26 and 27 are provided so as to project from the base substrate 11 of the heat sink body 1, and the heatsink body 1 is mounted on the header 3 in a state that the insertion tubes 26 and 27 are inserted in the header 3. The circulation orifices 16 are formed through the insertion tubes 26 and 27.

In the header 3, as shown in FIG. 10, a first receiving tube 38 which communicates with the supply path 32 at one end and is opened to the supply port 34 at the other end and a second receiving tube 39 which communicates with the discharge path 33 at one end and is opened to the discharge port 35 at the other end are formed. Inside of each receiving tubes 38 and 39, a pair of retaining grooves 38a and 39a are formed to retain sealing members 7, so that the sealing members 7 are retained at predetermined positions in the receiving tubes 38 and 39.

The receiving tubes 38 and 39 have a diameter and a height such that the insertion tubes 26 and 27 are insertable therein. The sealing members 7 are brought into close contact with outer peripheral surfaces of the insertion tubes 26 and 27, and the sealing members 7 are compressed between the insertion tubes 26 and 27 and bottom surfaces of the retaining grooves 38a and 39a. As a result, a watertight sealing is provided between inner peripheral surfaces of the receiving tubes 38 and 39 and the outer peripheral surfaces of the insertion tubes 26 and 27.

Accordingly, by inserting the insertion tubes 26 and 27 of the heatsink body 1 into the receiving tubes 38 and 39 of the header 3, and by fixing the heatsink body 1 to the header 3 with the mount screws 19, the header 3 and the heatsink body 1 are coupled to each other in a watertight manner.

Incidentally, in a case that the header 3 is made of a metal, the base substrate 11 of the heatsink body 1 is electrically connected with the header 3. Accordingly, when the heatsink bodies 1 are connected in series, it is desirable that the spacer 3b is provided for insulation as described in the first embodiment, or the header 3 is formed with an insulating material such as synthetic resin. On the other hand, when the heatsink bodies 1 are connected in parallel, the base substrates 11 may be connected directly with the header 3 by forming the header 3 with a metal material.

According to the structure of the present embodiment where the insertion tubes 26 and 27 and the receiving tubes 38 and 39 are sealed in the watertight manner by use of the sealing members 7 provided within the receiving tubes 38 and 39, the watertight property can be enhanced by making sealing distances long (the sealing distance is defined as the distance of the adjacent sealing members in the receiving tube). Further, since the insertion holes 26 and 27 of the heatsink body 1 are inserted into the receiving tubes 38 and 39 of the header 3, the heatsink body 1 can be tentatively fixed and positioned on the header 3 before completely mounted. Therefore, the mounting process of the heatsink body 1 on the header 3 can be performed easily.

In other respects, the third embodiment is identical in structure and operation with the first embodiment and the second embodiment. Incidentally, also in the first and the second embodiments, it is possible to omit the spacer 3b by forming the header 3 with a synthetic resin, and to employ the mount screws 19 formed with a metal material. Further, in the first embodiment, when the heatsink bodies 1 are connected in parallel, not in series, it is possible to employ a structure in which the base substrate 11 is brought into direct contact with the header 3 made of the metal. In the second embodiment, on the other hand, it is necessary to provide the sealing member 6 with a conductive material (a metal material is used for example) for obtaining such a structure.

What is claimed is:

1. A heatsink adapted to be coupled to a mount surface of a header in which a supply path and a discharge path for passing a cooling fluid are formed, the heatsink comprising:
   a heatsink body which supports a heating element and in which a flow passage for the cooling fluid is formed therein, the heatsink body being coupled to the header so that a contact surface of the heatsink body is brought into contact with the mount surface of the header,
   wherein a first circulation orifice through which the cooling fluid is introduced from the supply path and a second circulation orifice through which the cooling fluid is discharged to the discharge path are formed on the contact surface of the heatsink body,
   a plurality of supply ports through which the cooling fluid is supplied to the first circulation orifice by communicating with the supply path and a plurality of discharge ports through which the cooling fluid is discharged communicating with the discharge path are formed on the mount surface of the header;
   a plurality of the heatsink bodies are coupled to the header, and
   the first circulation orifice is coupled to one of the supply ports in a watertight manner and the second circulation orifice is coupled to one of the discharge ports in a watertight manner,
   wherein a sheet-shape sealing member is interposed between the heatsink body and the header so as to couple between the heatsink body and the header in a watertight manner, and
   a supply hole which communicates the first circulation orifice and the supply port with each other and a discharge hole which communicates the second circulation orifice and the discharge port with each other are formed in the sealing member so as penetrate in a thickness direction of the sealing member.

2. A heatsink adapted to be coupled to a mount surface of a header in which a supply path and a discharge path for passing a cooling fluid are formed, the heatsink comprising:
   a heatsink body which supports a heating element and in which a flow passage for the cooling fluid is formed therein, the heatsink body being coupled to the header so that a contact surface of the heatsink body is brought into contact with the mount surface of the header,
   wherein a first circulation orifice through which the cooling fluid is introduced from the supply path and a second circulation orifice through which the cooling fluid is discharged to the discharge path are formed on the contact surface of the heatsink body,
   a plurality of supply ports through which the cooling fluid is supplied to the first circulation orifice by communicating with the supply path and a plurality of discharge ports through which the cooling fluid is discharged by communicating with the discharge path are formed on the mount surface of the header;
   a plurality of the heatsink bodies are coupled to the header, and
   the first circulation orifice is coupled to one of the supply ports in a watertight manner and the second circulation orifice is coupled to one of the discharge ports in a watertight manner,
   wherein a first receiving tube which communicates with the supply path at one end thereof and is opened to one of the supply ports at another end thereof and a second receiving tube which communicates with the discharge path at one end thereof and is opened to one of the discharge ports at another end thereof are formed in the header, the heat sink body includes a pair of insertion tubes provided on the contact surface so as to project therefrom and so as to be inserted into the first and second receiving tubes in the header, the first circulation orifice is penetrated in one of the insertion tubes, and the second circulation orifice is penetrated in another of the insertion tubes, and sealing members are provided inside of the first and second receiving tubes and are brought into contact with outer peripheral surfaces of the insertion tubes, so that inner peripheral surfaces of the first and second receiving tubes and the outer peripheral surfaces of the insertion tubes are sealed in a watertight manner.

3. A heatsink adapted to be coupled to a mount surface of a header in which a supply path and a discharge path for passing a cooling fluid are formed, the heatsink comprising:

a heatsink body which supports a heating element and in which a flow passage for the cooling fluid is formed therein, the heatsink body being coupled to the header so that a contact surface of the heatsink body is brought into contact with the mount surface of the header, wherein a first circulation orifice through which the cooling fluid is introduced from the supply path and a second circulation orifice through which the cooling fluid is discharged to the discharge path are formed on the contact surface of the heatsink body, a plurality of supply ports through which the cooling fluid is supplied to the first circulation orifice by communicating with the supply path and a plurality of discharge ports through which the cooling fluid is discharged by communicating with the discharge path are formed on the mount surface of the header;

a plurality of the heatsink bodies are coupled to the header, and the first circulation orifice is coupled to one of the supply ports in a watertight manner and the second circulation orifice is coupled to one of the discharge ports in a watertight manner, wherein recesses are formed at least either around the first and second circulation orifices in the contact surface of the heatsink body or around at least one of the supply ports and at least one of the discharge ports in the mount surface of the header, annular sealing members that exhibit rubber elasticity are disposed in the recesses, and the heatsink body is joined to the header such that the sealing members are compressed between the heatsink body and the header.

4. The heatsink according to claim 1, wherein the heating element is a light emitting diode.

5. The heatsink according to claim 1, wherein the header is formed with an insulating synthetic resin material.

6. A semiconductor device comprising: the heat sink according to claim 1, wherein the heating element is a semiconductor element, the heatsink body is provided with a stacked body including a base substrate provided with a metal plate and thermally coupled to the semiconductor element as well as electrically connected with one electrode of the semiconductor element, and a cover substrate provided with a metal plate and electrically connected with another electrode of the semiconductor element and an insulating material layer insulating between the base substrate and the cover substrate.

7. The heatsink according to claim 1, wherein each of the plurality of the heatsink bodies is coupled to the header by a fastening member.

8. The heatsink according to claim 2, wherein the heating element is a light emitting diode.

9. The heatsink according to claim 2, wherein the header is formed with an insulating synthetic resin material.

10. A semiconductor device comprising: the heat sink according to claim 2, wherein the heating element is a semiconductor element, the heatsink body is provided with a stacked body including a base substrate provided with a metal plate and thermally coupled to the semiconductor element as well as electrically connected with one electrode of the semiconductor element, and a cover substrate provided with a metal plate and electrically connected with another electrode of the semiconductor element and an insulating material layer insulating between the base substrate and the cover substrate.

11. The heatsink according to claim 2, wherein each of the plurality of the heatsink bodies is coupled to the header by a fastening member.

12. The heatsink according to claim 3, wherein the heating element is a light emitting diode.

13. The heatsink according to claim 3, wherein the header is formed with an insulating synthetic resin material.

14. A semiconductor device comprising: the heat sink according to claim 3, wherein the heating element is a semiconductor element, the heatsink body is provided with a stacked body including a base substrate provided with a metal plate and thermally coupled to the semiconductor element as well as electrically connected with one electrode of the semiconductor element, and a cover substrate provided with a metal plate and electrically connected with another electrode of the semiconductor element and an insulating material layer insulating between the base substrate and the cover substrate.

15. The heatsink according to claim 3, wherein each of the plurality of the heatsink bodies is coupled to the header by a fastening member.

* * * * *